US005131155A

United States Patent [19]

Takano et al.

[11] Patent Number: 5,131,155

[45] Date of Patent: Jul. 21, 1992

[54] APPARATUS AND METHOD FOR MEASURING FORWARD DIRECTION OF VEHICLE

[75] Inventors: Kenji Takano; Hiroshi Tsuda; Hiroshi Ueno, all of Kanagawa, Japan

[73] Assignee: Nissan Motor Company, Limited, Kanagawa, Japan

[21] Appl. No.: 459,389

[22] Filed: Jan. 5, 1990

[30] Foreign Application Priority Data

Jan. 6, 1989 [JP] Japan ........................................ 64-525

[51] Int. Cl.[5] ........................ G01C 17/28; G01C 17/38

[52] U.S. Cl. ........................................ 33/356; 33/361; 33/357; 364/571.02; 364/571.05

[58] Field of Search ...................... 33/355 R, 356, 361, 33/357; 364/571.02, 571.05

[56] References Cited

U.S. PATENT DOCUMENTS 4,416,067 11/1983 Scherer et al. ........................ 33/357
4,442,609 4/1984 Senoo ........................................ 33/356
4,445,279 5/1984 Tsushima et al. ............. 364/571.05
4,497,034 1/1985 Kuno et al. ........................... 33/361
4,539,760 9/1985 Marchent et al. .................... 33/357
4,611,293 9/1986 Hatch et al. .
4,660,161 4/1987 Okada .
4,672,565 6/1987 Kuno et al. ........................... 33/357
4,686,772 8/1987 Sobel ........................................ 33/361
4,750,349 6/1988 Luitje .
4,751,783 6/1988 Ina et al. ............................... 33/361
4,771,547 9/1988 Akutsu et al. .
4,782,453 11/1988 Bauer et al. ........................... 33/357
4,791,574 12/1988 Thoone et al. .
4,797,841 1/1989 Hatch .
4,841,449 6/1989 Suyama ................................. 33/356
4,852,012 7/1989 Suyama .
4,862,398 8/1989 Shimizu et al. ....................... 33/361
4,866,627 9/1989 Suyama ................................ 33/356
4,870,602 9/1989 Bäumker ............................... 33/356

FOREIGN PATENT DOCUMENTS 2484079 12/1981 France ................................. 33/356
59-100812 6/1984 Japan .
6446612 8/1987 Japan .
63-48415 3/1988 Japan .
0046612 2/1989 Japan .................................... 33/361
1-117712 8/1989 Japan .
1-144814 10/1989 Japan .

*Primary Examiner*—William A. Cuchlinski, Jr.
*Assistant Examiner*—Alvin Wirthlin
*Attorney, Agent, or Firm*—Lowe, Price, LeBlanc & Becker

[57] ABSTRACT

An apparatus and method for measuring a forward direction of a vehicle in which to derive a coordinate position of a center ($O_x$, $O_y$) of a directional circle derived from an output of a geomagnetic direction sensor after a magnetization on a vehicle body occurs, the magnetization on the vehicle body is determined from the output of the geomagnetic direction sensor installed in the vehicle and each parameter of a peak quantity ($X_{max}$, $Y_{max}$), peak direction ($D_x$, $D_y$), and a center value of an output circle before the present disturbance occurs is calculated, optimum coefficients are selected and set according to each parameter from among the previously derived coefficients, a magnetization quantity is calculated from each parameter and each optimum coefficient using a linear combination technique, and the coordinate position of the center of the output circle after the magnetization on the vehicle body occurs from the derived magnetization quantity.

14 Claims, 9 Drawing Sheets

FIG. 13

APPARATUS AND METHOD FOR MEASURING FORWARD DIRECTION OF VEHICLE

BACKGROUND OF THE INVENTION (1) Field of the Invention

The present invention relates to an apparatus and method for measuring a running direction of a vehicle using a geomagnetic direction sensor. The present invention, more particularly, relates to the apparatus and method for automatically correcting the measured running direction of the vehicle including an error caused by a magnetization on a vehicle body.

(2) Description of the Background Art

One of previously proposed apparata for measuring running directions of vehicles is exemplified by a Japanese Patent Application First Publication (Non-examined) Shows 59-100812 published on Jun. 11, 1984.

In the above-described Japanese Patent Application First Publication, a geomagnetic direction sensor, in which a pair of windings are intersected perpendicularly to each other on a circular core in a horizontal posture, is used for measuring the running direction of the vehicle. Detected voltages (output values) corresponding to the geomagnetic directional components are derived respectively according to interlinked geomagnetism to the respective windings.

When the vehicle is made one turn under the uniform geomagnetism, a circle (output circle derived from the geomagnetic direction sensor) is described on a coordinate plane prepared from an X - Y coordinate indicated by detected voltages of these core windings. Hence, a direction from a center of the output circle to the coordinates indicated by the detected voltages of both windings is derived as the forward direction of the vehicle during a normal running of the vehicle.

In the above-described direction measuring apparatus, center coordinates of the output circle is moved when the vehicle body is magnetized so that an error is generated in the detection result of the running direction. To correct the erroneous detection result, the vehicle is made one turn and during one turn of the vehicle the output values of the geomagnetic direction sensor are appropriately sampled each at a predetermined sampling period.

Then, upon completion of the one turn, the sampled output values are averaged to correct the error in the detected running direction of the vehicle.

On the other hand, another of the previously proposed vehicle running direction measuring apparata is exemplified by a Japanese Patent Application First Publication (Non-examined) No. Shows 63-48415 published on Mar. 1, 1988.

In the latter Japanese Patent Application First Publication, a method of correcting the erroneous detected output values due to the magnetization of the vehicle body is such that a plurality of phantom X axis and phantom Y axis are drawn in parallel to the X axis and Y axis on the VX-VY plane of the output of the direction measuring apparatus. If the outputs of the direction measuring apparatus are placed on two points on the phantom X axis and on two points on the phantom Y axis, the correction for the erroneous detected voltages due to the magnetization on the vehicle body is carried out.

However, the above-described previously proposed direction measuring apparata have the following drawbacks.

Since, in the former direction measuring apparatus, a small amount of sampled output values are used to process the average calculation even when a magnetism environment is not preferable during the correction of the magnetization, it is not possible to derive the position of the center coordinates of the output circle with high accuracy and the vehicle driver is required to make the vehicle one turn (360°).

Since, in the latter direction measuring apparatus, two points of intersections between the two axis (X axis, Y axis) and directional circle are needed, the directional data of at least 180° or greater is required to measure the intersections.

However, since 180° turning of the vehicle is rare immediately after the vehicle is actually magnetized, the output of the direction measuring apparatus until the directional data of more than 180° are collected is deviated from the actual direction of the vehicle.

SUMMARY OF THE INVENTION

It is an object of the present invention to provide an apparatus and method for measuring a running direction of a vehicle in which a position of center coordinates of a directional (output) circle derived from the geomagnetic direction sensor after the magnetization of the vehicle body can be calculated with a high accuracy and without one turn of the vehicle to correct the detected result of direction in a case when the vehicle is magnetized.

The above-described object can be achieved by providing an apparatus comprising: a) a geomagnetic direction sensor, installed in a moving object, which detects a direction of the geomagnetism in a form of two directional component data mutually orthogonal to each other on a horizontal plane; b) first means for deriving a running direction of the moving object on the basis of a direction toward a coordinate position indicated by the two directional component data from coordinates of a center position of an output circle derived form the geomagnetic direction sensor; c) second means for determining whether a disturbance of magnetization occurs on a body of the moving object in which the geomagnetic direction sensor is installed from an output of the geomagnetic direction sen means for calculating each parameter of a peak direction of the disturbance of magnetization, a peak quantity, a value of a center of the output circle derived before the present magnetization occurs; e) fourth means for selecting and setting optimum coefficients according to each parameter calculated by the third means from among previously derived coefficients; f) fifth means for calculating a quantity of magnetization of the moving object using a linear combination between each parameter calculated by the third means and each coefficient selected by the fourth means; and g) sixth means for deriving a coordinate value of the center of the output circle derived after the disturbance of magnetization occurs.

The above-described object can also be achieved by providing an apparatus for measuring a running direction of a vehicle, comprising: a) a geomagnetic direction sensor for detecting geomagnetic direction components on a horizontal plane mutually perpendicular to each other, the output of the geomagnetic direction sensor describing a directional circle having a center coordinate position of the directional circle and the direction from the center of the directional circle to a coordinate position indicated by both geomagnetic directional components; b) first means for determining whether a disturbance against the geomagnetism on the vehicle body, i.e., magnetization on the vehicle body occurs in which the geomagnetic direction sensor is installed from an output of the geomagnetic direction sensor; c) second means for calculating each parameter of a peak direction of the disturbance of magnetization, a peak quantity, a value of a center of the output circle derived before the present magnetization occurs; d) third means for selecting and setting optimum coefficients according to each parameter calculated by the second means from among previously derived coefficients related to a magnetization quantity; e) fourth means for calculating the quantity of magnetization of the vehicle body using a linear combination between each parameter calculated by the second means and each coefficient selected by the third means; and f) fifth means for deriving a coordinate value of the center of the output circle derived after the disturbance of magnetization occurs.

The above-described object can also be achieved by providing a method for measuring a running direction of a moving object, comprising the steps of; a) providing a geomagnetic direction sensor in a moving object, the geomagnetic direction sensor detecting a direction of the geomagnetism in a form of two directional component data mutually orthogonal to each other on a horizontal plane; b) deriving a running direction of the moving object on the basis of a direction toward a coordinate position indicated by the two directional component data from coordinates of a center position of an output circle derived form the geomagnetic direction sensor; c) determining whether a disturbance of magnetization occurs on a body of the moving object in which the geomagnetic direction sensor is installed from an output of the geomagnetic postion sensor; d) calculating each parameter of a peak direction of the disturbance of magnetization, a peak quantity, a value of a center of the output circle derived before the present magnetization occurs; e) selecting and setting optimum coefficients according to each parameter calculated in the step d) from among previously derived coefficients; f) calculating a quantity of magnetization of the moving object using a linear combination between each parameter and each coefficient selected by the fourth means; and g) deriving a coordinate value of the center of the output circle derived after the disturbance of magnetization occurs.

BRIEF DESCRIPTION OF THE DRAWINGS

FIG. 13 is an operation flowchart of calculating a set of coefficients in the magnetization quantity calculating block.

DETAILED DESCRIPTION OF THE PREFERRED EMBODIMENTS

Reference will hereinafter be made to the drawings in order to facilitate a better understanding of the present invention.

Figure 1:
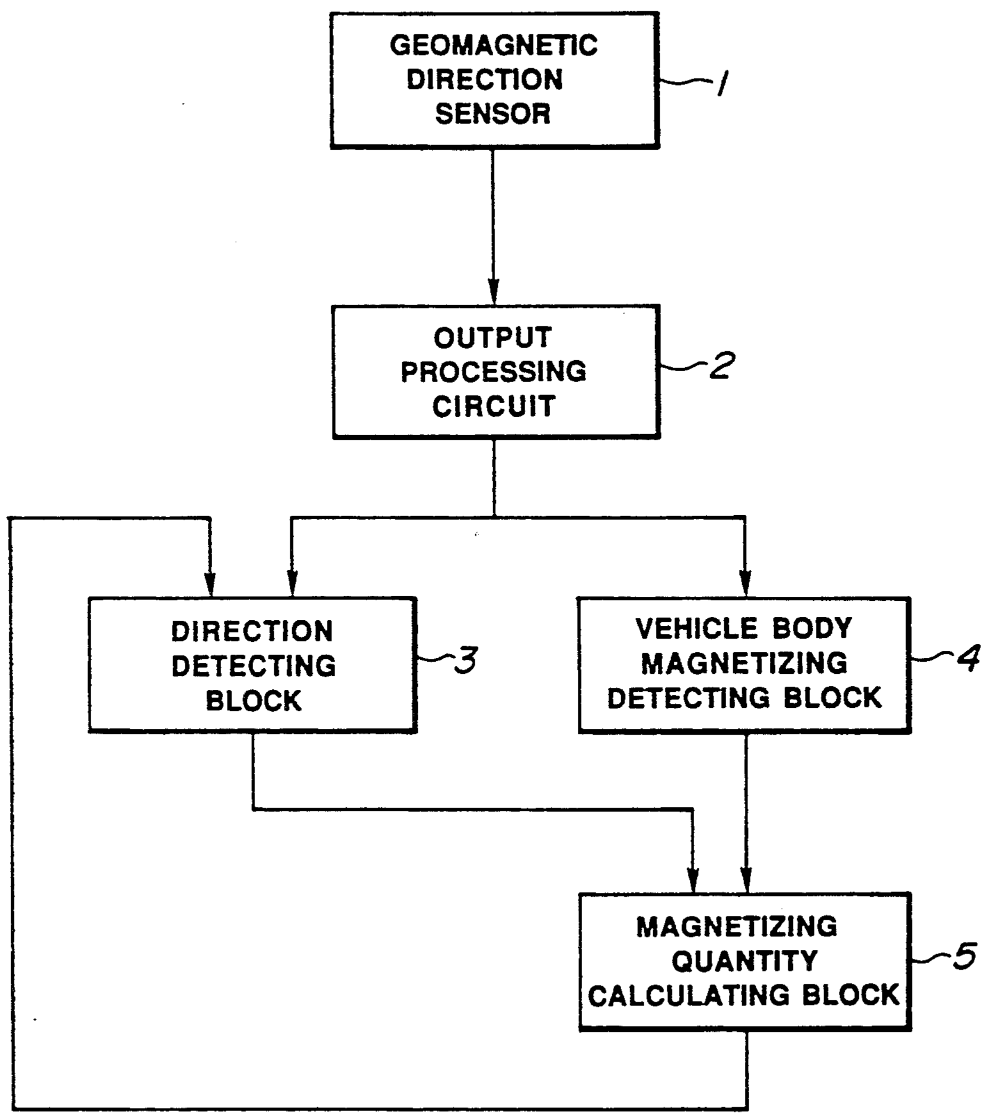
FIG. 1 is a schematic circuit block diagram of an apparatus for measuring a running direction of a vehicle in a preferred embodiment according to the present invention.

FIG. 1 shows a circuit block diagram of an apparatus for measuring a running direction of a vehicle in a preferred embodiment according to the present invention.

In FIG. 1, a geomagnetic direction sensor 1 resolves geomagnetic components into two directional components mutually perpendicular to each other on a horizontal plane and outputs the geomagnetic components in the respective directions in the form of electrical signals.

In addition, an output processing circuit 2 converts output signals of the geomagnetic direction sensor 1 into a corresponding digital signal. A direction detecting block 3 detacts a direction of the vehicle from the output signals of the geomagnetic direction sensor 1. A vehicle body magnetization detecting block 4 detects the magnetization on the vehicle body. A vehicle body magnetization quantity calculating block 5 carries out the calculation of the magnetized quantity on the vehicle body as will be described below.

It is noted that the direction detecting block 3, magnetization detecting block 4, and magnetization quantity calculating block 5 are constituted by, e.g., a microcomputer. It is noted that the microcomputer generally includes a CPU (Central Processing Unit), RAM (Random Access Memory), ROM (Read Only Memory), and I/O Unit.

Figure 2:
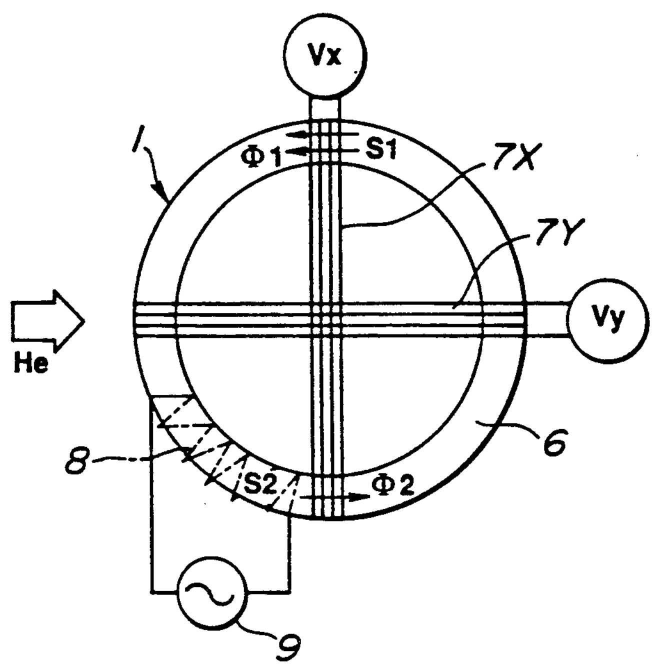
FIG. 2 is a schematic circuit wiring diagram of a geomagnetic direction sensor used in the apparatus shown in FIG. 1.

FIG. 2 shows a structure of the geomagnetic direction sensor 1 used in the preferred embodiment.

The geomagnetic direction sensor 1 includes a circular (endless) magnetic core 6 made of a permalloy and a pair of windings 7X, 7Y wound on the magnetic core 6 so as to be orthogonal to each other. Furthermore, a winding 8 is wound on the periphery of the magnetic core 6. An energization power supply (AC power supply) 9 is connected to the winding 8 to supply the energization power supply 9 thereto. Therefore, the permalloy core 6 is energized immediately before the core 6 becomes saturated as shown in the characteristic of FIG. 2.

Another structure of the geomagnetic direction sensor 1 is exemplified by a U.S. Pat. No. 4,442,609 issued on Apr. 17, 1984, the disclosure of which is hereby incorporated by reference.

Figure 3:
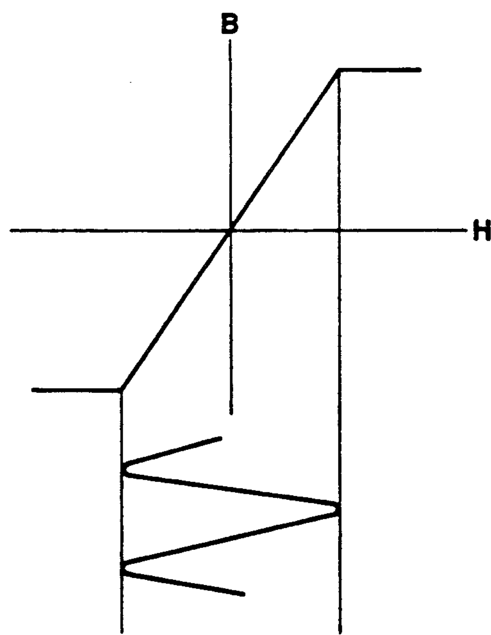
FIG. 3 is a characteristic graph of energization of the geomagnetic direction sensor shown in FIG. 2.
Figure 4:
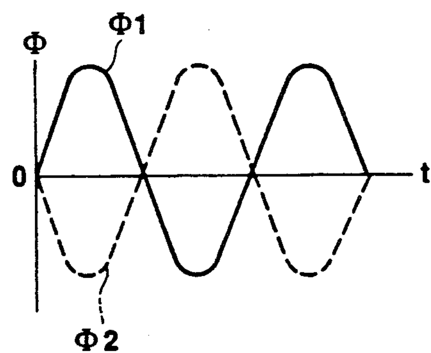
FIG. 4 is a characteristic graph of a change in magnetic flux on a permalloy core of the geomagnetic direction sensor under no application of magnetic field.

When the geomagnetic direction sensor 1 is placed in a non-magnetic field with the power supplied to the winding 8, magnetic flux $\phi_1$, and magnetic flux $\phi_2$ passing through positions $S_1$ and $S_2$ of the parmalloy core 6, respectively, have the same magnitudes and opposite directions (180° out of phase with each other) to each other, as shown in FIG. 3.

Hence, as the magnetic flux interlinked to the winding 7X becomes zero, its detecting voltage, i.e., $V_x = -N\, d\phi/dt$ (N denotes the number of turns of the winding), also becomes zero and similarly its detecting voltage $V_y$ of the winding 7Y also becomes zero.

Furthermore, when the geomagnetic field He is applied perpendicular to the winding 7X as shown in FIG. 2, a bias of the magnetic flux density expressed as $Be=\mu He$ ($\mu$ denotes a permeability of the permalloy) is given to the magnetic flux in the magnetic core 6.

Figure 5:
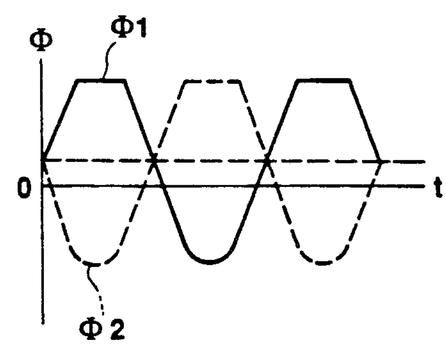
FIG. 5 is a characteristic graph of a detection action of the geomagnetic direction sensor.

Thus, the magnetic flux of $\phi_1$ and $\phi_2$ are asymmetrical, as shown in FIG. 5.

Figure 6:
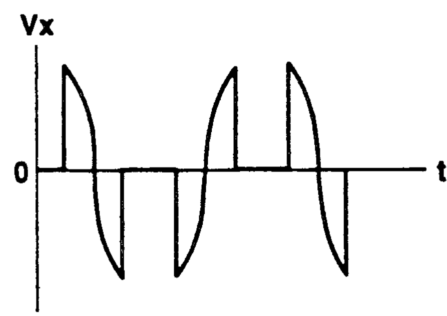
FIG. 6 is a characteristic graph of detection voltages of the geomagnetic direction sensor.

Hence, the winding 7X derives the detecting voltage $V_x$ of a waveform shown in FIG. 6.

It is noted that since the geomagnetic field He is parallel to the winding 7Y, in the case of FIG. 2, no geomagnetic field is applied to the winding 7Y so that no voltage Vy is generated in the winding 7Y.

Figure 7:
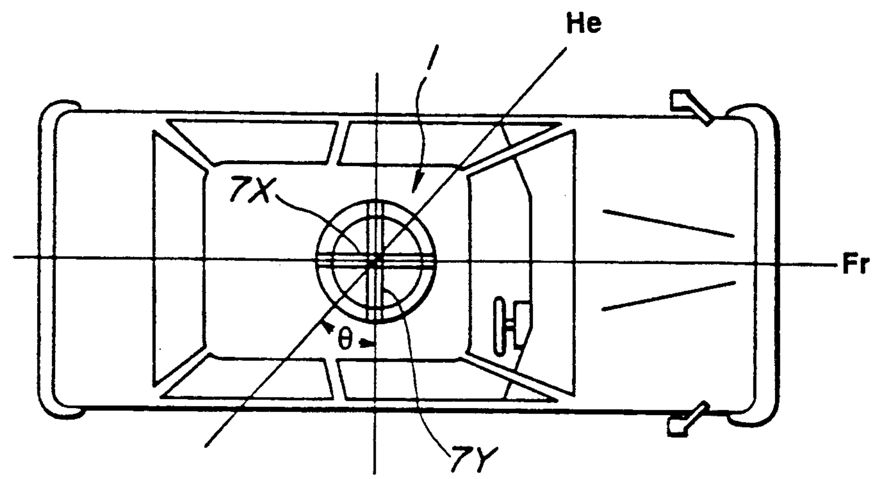
FIG. 7 is an elevational view of a mounting state of the geomagnetic position sensor on a vehicle body and of a running direction of the vehicle.

The geomagnetic direction sensor 1 is mounted on the vehicle in a horizontal posture as shown in FIG. 7. For example, when the geomagnetic field He is applied to both of the windings 7X, 7Y, the detecting voltages $V_x$ and $V_y$ (output values) according to the geomagnetic field are respectively derived on the windings 7X, 7Y, as shown in FIG. 7.

The detecting voltages $V_x$, $V_y$ are expressed in the following equations (1) and (2) if the value K is a winding constant and the value B is a horizontal component of the geomagnetism He.

$$V_x = KB \cos\theta \quad (1)$$

$$V_y = KB \sin\theta \quad (2)$$

Hence, an angle $\theta$ of the forward direction of the vehicle with respect to a width direction of the vehicle body (shown in FIG. 7) can be expressed in the following equation (3).

$$\theta = \tan^{-1}(V_x/V_y) \quad (3)$$

Figure 8:
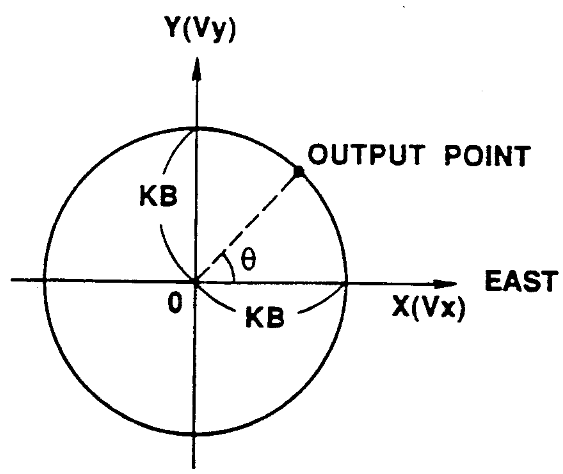
FIG. 8 is an explanatory view of an output circle derived from the geomagnetic direction sensor.

As appreciated from the above-expressed equations (1) and (2), when the vehicle is made one turn under a uniform geomagnetic field He, an circle (output, directional circle) is described on the X, Y coordinate plane, as shown in FIG. 8.

The output circle derived from the geomagnetic direction sensor 1 is expressed in the equation (4).

$$V_x^2 + V_y^2 = (KB)^2 \quad (4)$$

In this way, since the coordinates defined by detecting voltages $V_x$, $V_y$ of the windings 7X, 7Y are present on the output circle, the direction from the center O of the output circle toward the coordinate point (output point shown in FIG. 7) can be detected as the running (forward) direction of the vehicle.

Figure 9:
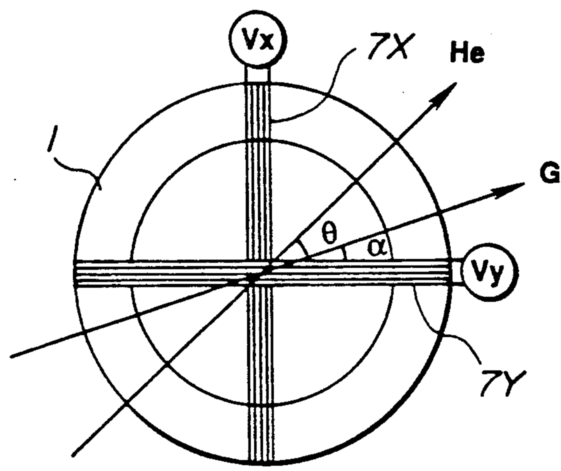
FIG. 9 is an explanatory view of the geomagnetic direction sensor when a magnetic field other than the geomagnetic field is applied to the geomagnetic direction sensor.
Figure 10:
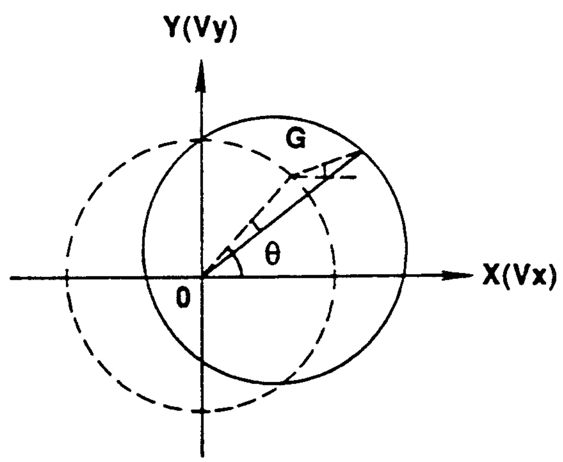
FIG. 10 is an explanatory view of an movement of the output circle due to the magnetization on the vehicle body.

Suppose that when a new magnetic field G generated due to the magnetization on the vehicle body together with the geomagnetism He, as shown in FIG. 9, is interlinked to the windings 7X, 7Y, the output circle is moved from a broken line position to a solid line position, as shown in FIG. 10.

Consequently, an error occurs in the detection result of the running direction of the vehicle carried out at the direction detecting block 3.

In order to automatically correct the above-described generated error, the magnetization on the vehicle body is accurately detected by means of the magnetization detecting block 4.

The contents of calculations in the vehicle body magnetization detecting block 4 will be described with reference to a flowchart of FIG. 11.

In a first step 200, the directional signals X and Y derived from the output processing circuit 2 (hereinafter, the output $V_x$ of the geomagnetic direction sensor 1 is abbreviated as X and the output $V_y$ of the geomagnetic direction sensor 1 is abbreviated as Y) are input so that in a step 220, a sensor output counter (not shown) installed in the vehicle body magnetization detecting block 4 is counted up by "1".

Next, in a step 230 the direction signals input in the step 210 is set as $X_i$, $Y_i$ and stored in a memory (not shown) installed within the vehicle body magnetization detecting block 4.

In a step 240, the CPU (constituting the magnetization detecting block 4) determines whether a value of the sensor output counter indicates "20".

If the counter does not indicate "20", the routine returns to the step 210 and the above-described steps 210, 220, 230, and 240 are repeated until it indicates "20".

If the counter indicates "20" and the twenty direction signals are stored in the memory, the routine goes to a step 250. An average value of the output X, Y is calculated in the following equation:

$$\bar{X} = \sum_{i=1}^{20} X_i/20$$

$$\bar{Y} = \sum_{i=1}^{20} Y_i/20$$

Hereinafter, the average values $(\bar{X}, \bar{Y})$ are referred to as a "reference point".

It is noted that the coordinates system of the reference point, center position of the output circle, peak point, and base point (the peak point and base point will be described later) and an origin of the system is a center point $O_s$ of an output directional circle under no magnetization of the vehicle body, (i.e., the directional voltages of the X and Y are zero).

In a step 260, directional signals X, Y derived from the output processing circuit 2 are again input. Then, in a step 270, a difference R between the directional signals X, Y and average value of the sensor output calculated in the step 250 is derived in the following equation.

$$R = \{(X-\bar{X})^2 + Y-\bar{Y})^2$$

In a step 280, the CPU determines whether the above-described difference R is below 40 milligausses (mG) corresponding to an intensity of the geomagnetism.

That is to say, if NO in the step 280 (in a case where the difference R is larger than 40 mG), the CPU determines that the peak output (magnetic disturbance) has been generated.

In a step 280, if YES (R≦40 mG), the oldest output values $X_1$ and $Y_1$ are discarded and the output values are sequentially replaced as $X_2$ to $X_1$, $Y_2$ to $Y_1$, and so on in steps 290 and 300. At this time, the replacement operation is continued until $X_{20}$ to $X_{19}$, $Y_{20}$ to $Y_{19}$, as shown in steps 310 and 320.

In a step 330, the latest output values X, Y are stored as $X_{20}$, $Y_{20}$ and the routine returns again to a step 250 to update the average value (reference point). Hereinafter, the series of processings in steps 250 to 330 are repeated until the peak output is generated.

On the other hand, if NO in the step 280, a rise in the peak output is detected. In this case, an update processing of the reference point is halted. New directional signals $X_n$, $Y_n$ (coordinates of the peak point) are input from the output processing circuit 2 in a step 340.

A difference $R_t$ between the directional signals $X_n$, $Y_n$ and average value of the sensor output calculated in the step 350, i.e., a distance between the reference point and present values $X_n$, $Y_n$ is derived using the following equation.

$$R_t=\{(X_n-\overline{X})^2+(Y_n-\overline{Y})^2\}^{\frac{1}{2}}$$

In a step 360, the CPU compares the present distance data Rt with a previous distance data derived in the step 270. If the present data Rt exceeds the previous data R, the routine goes to a step 370. If the present data Rt is below the previous data R, the routine goes immediately to a step 380. In the step 370, the present distance data $R_t$ is set as R and the present input signals $X_n$, $Y_n$ are replaced with $X_{max}$, $Y_{max}$, respectively, and thereafter the routine goes to the step 380.

In a step 380, when the geomagnetic direction sensor 1 generates a sharp peak in the detected output voltage (generation of geomagnetic disturbance), the CPU determines whether a distance R between its peak point and reference point is larger than 450 milligausses (mG) in an intensity of the geomagnetism. If it is larger than 450 mG, the CPU determines that the vehicle body has magnetized. If not larger than 450 mG, the vehicle body is determined that no such disturbance as magnetization occurs and the routine returns to the step 200 to repeat the processing described above.

If YES in the step 380, i.e., the CPU determines that the vehicle body has magnetized, the routine goes to a step 410 in which the magnetization calculating block 5 is carried out.

Next, the contents of calculation in the magnetization quantity calculation block 5 will be described in details.

Figure 11:
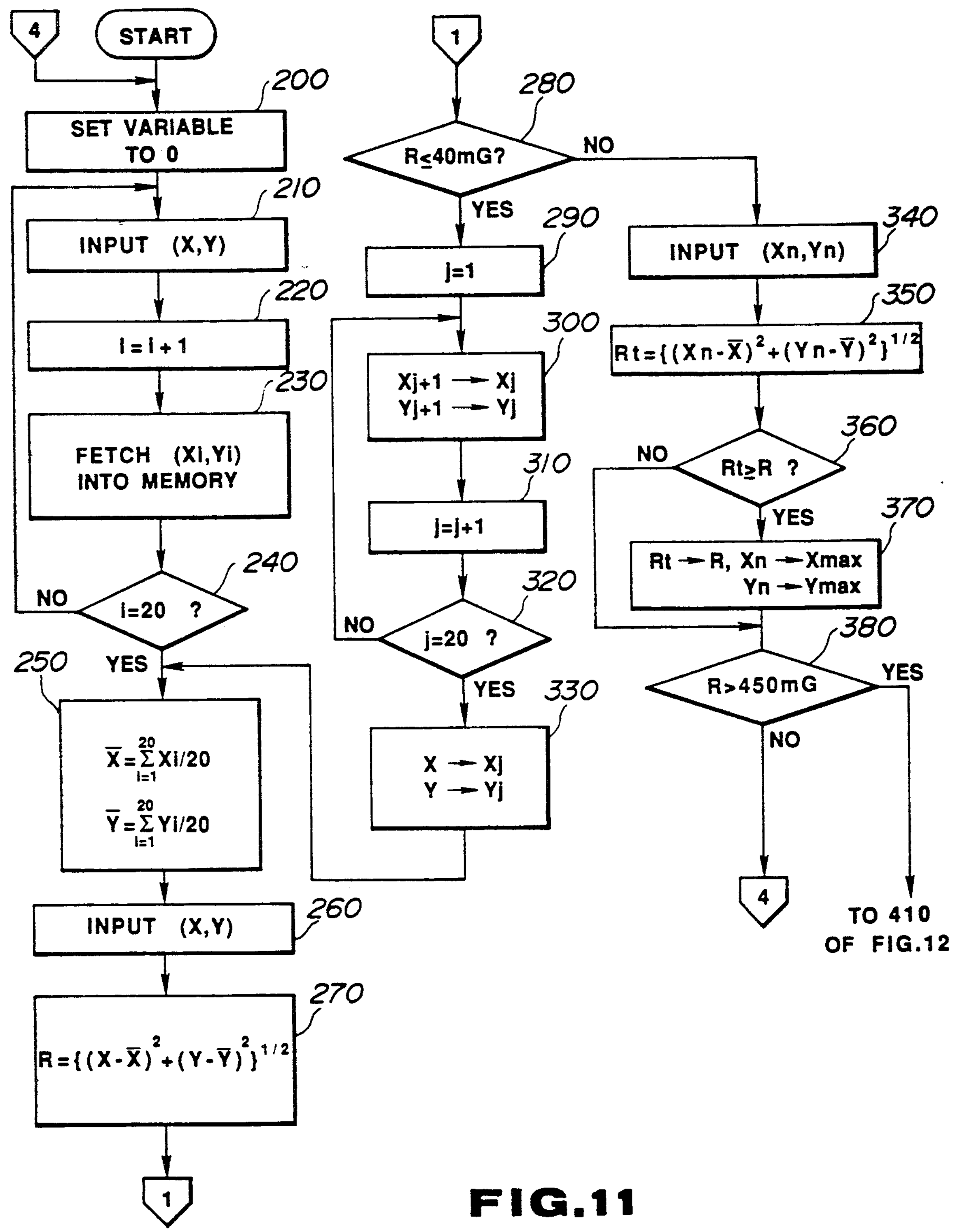
FIG. 11 is an operational flowchart of detecting a magnetization on the vehicle body shown in FIG. 1.
Figure 12:
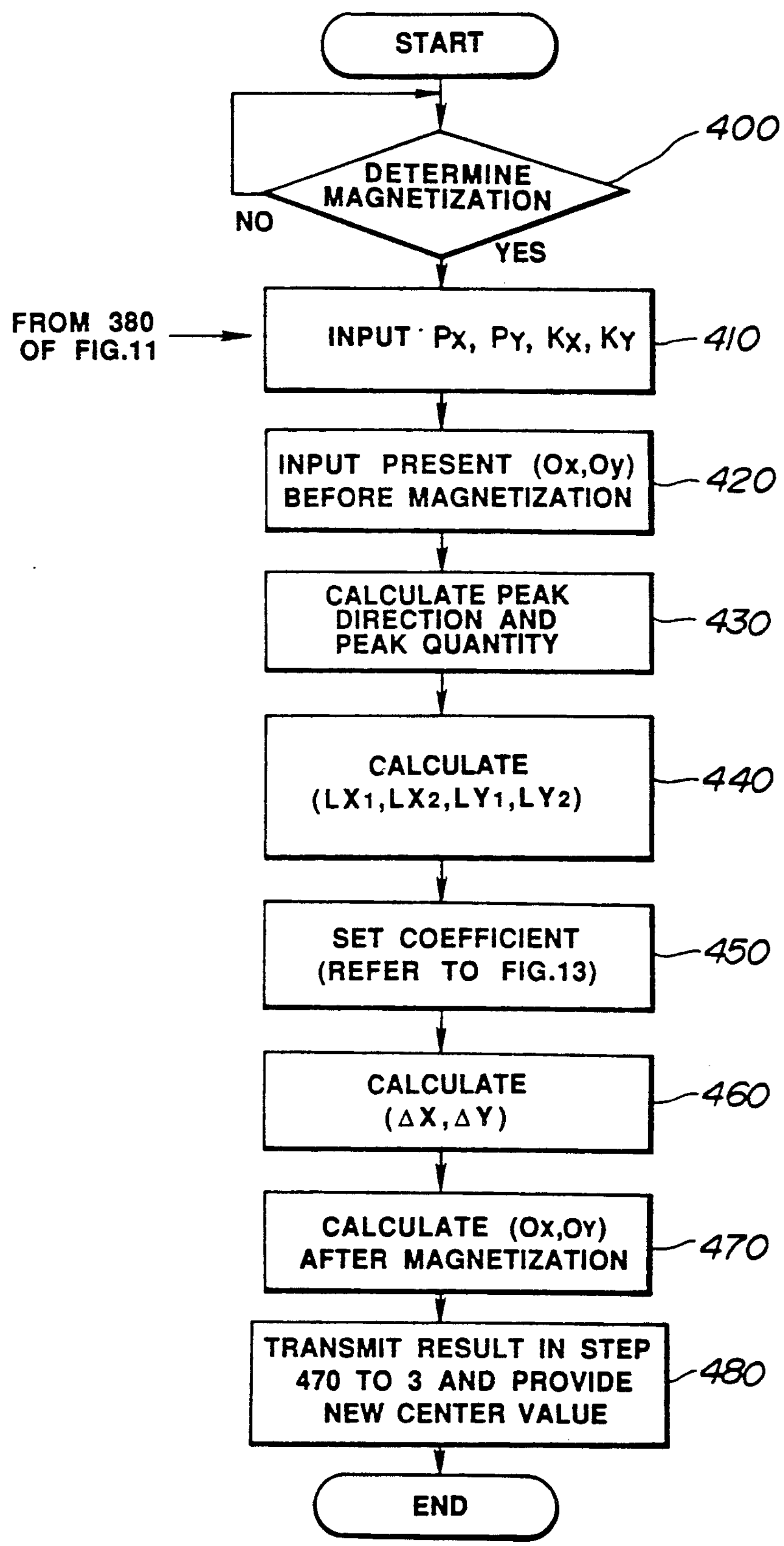
FIG. 12 is an operational flowchart of calculation of a magnetization quantity executed by a magnetization quantity calculating block shown in FIG. 11.

When the magnetization is determined in a step 400 (YES in the step 380 of FIG. 11), the routine goes to a step 410 in which the peak coordinate and reference coordinate (coordinates in the reference point and peak point derived in the calculation of FIG. 11) are inputted in the step 410.

In addition, in a step 420, a center coordinate of a directional circle from the center detecting block 3 is inputted (a center coordinate O of the output circle in FIG. 8).

Next, in a step 430, the CPU constituted by the vehicle body magnetization detecting block 4 calculates the peak quantity and peak direction using the following equation.

Peak Quantity $X_{max} = |Px - Kx|$ $Y_{max} = |Py - Ky|$

Peak Direction $D_x = (Px - Kx)/(|Px - Kx|)$ $D_y = (Py - Ky)/(|Py - Ky|)$

The peak quantity denotes a distance from the reference point to the peak point, the peak direction denotes the direction of the peak point viewed from the reference point, i.e., two directions (+ or −, present) of X, Y coordinates of the peak point in the case where the reference point is the origin.

Figure 14:
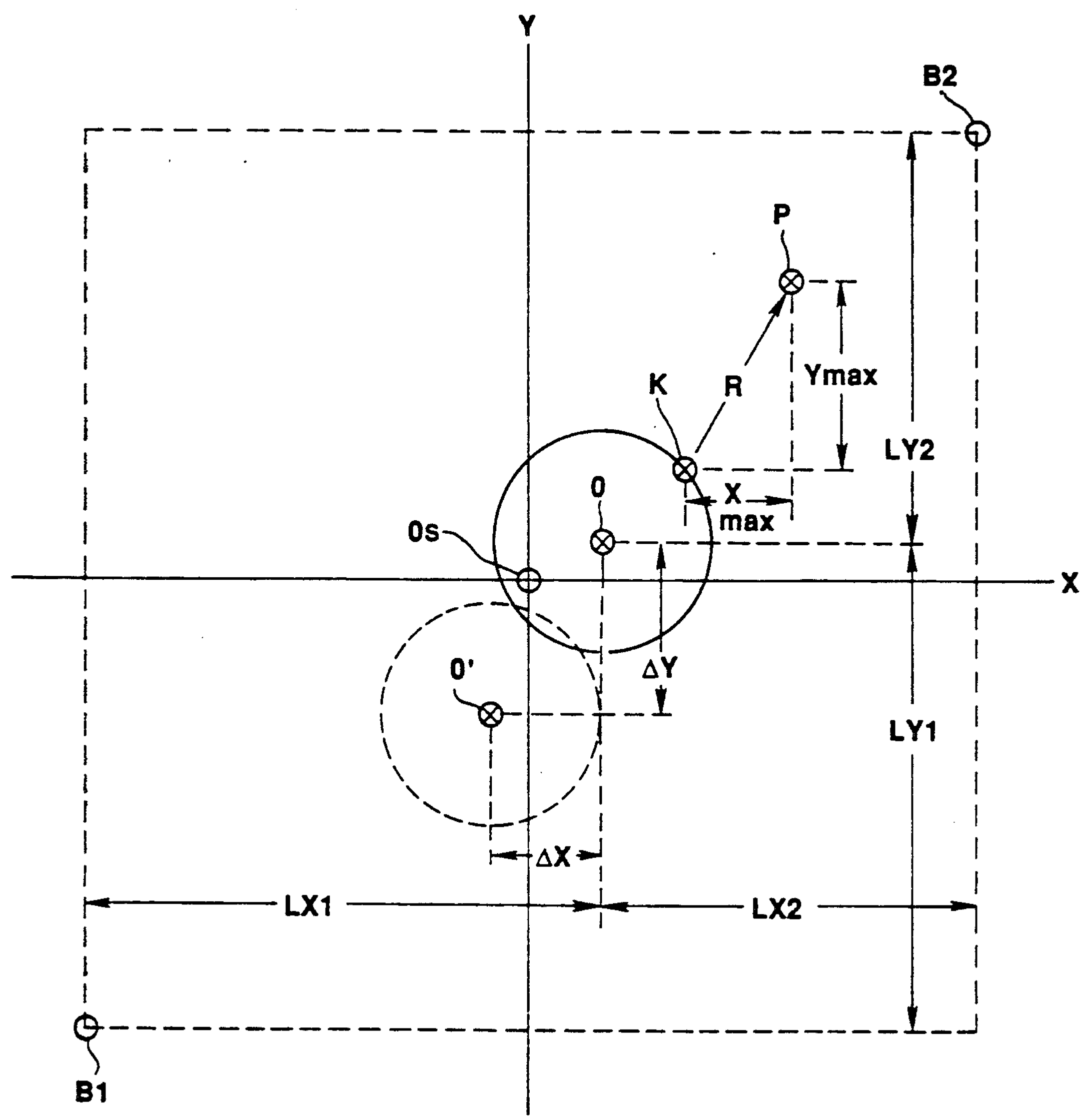
FIG. 14 is an explanatory view of an output directional circle and a movement of a directional circle due to the magnetization on the vehicle body.

Next, in a step 440, the CPU sets the base point B1 and base point B2 at points at which the values of the center coordinates of the directional circle moved due to the vehicle body magnetization do not exceed are set, as appreciated from FIG. 14.

Then, distances $LX_1$, $LX_2$, $LY_1$, $LY_2$ in the two X, Y components from these points to the present center coordinate O of the directional circle before the present magnetization are calculated as follows.

$$LX_1=Ox-B1_x$$

$$LX_2=B2_x-O_x$$

$$LY_1=O_y-B1_y$$

$$LY_2=B2_y-O_y$$

Provided that $O_X$: X coordinate of O $O_y$: Y coordinate of O $B1_X$: X coordinate of B1

$B1_Y$: Y coordinate of B1

$B2_X$: X coordinate of B2

$B2_Y$: Y coordinate of B2

The above-described base points B1, B2 denote limits of a range in which a directional circle is moved due to the magnetization. B1 denotes a limit in a minus direction of X, Y axe and B2 denotes a limit in a plus direction. It is noted that although these limit values are set at reasonable values by experiments, they are applicable to all vehicle models if once derived (since no variations occur according to the vehicle models).

It is noted that although, in the coordinate systems of the preferred embodiment, a center position $O_s$ of the output circle is set as an origin in a case where no magnetization basically occurs, the center value of the output circle before the present magnetization is denoted by the distances $LX_1$, $LX_2$, $LY_1$, $LY_2$ from the base points B1, B2 as described above for the handling conveniences.

Next, coefficient settings for the magnetization quantity calculation ($a_{1n}$ through $a_{7n}$, $b_{1m}$ through $b_{7m}$) are carried out in a step 450.

These coefficients are set, with the above-described peak direction, peak quantity, and a center value (values of $LX_1$, $LY_1$) of the output circle before disturbance of magnetization being parameters, and set according to these values.

Next, in a step 460, the magnetization quantities ΔX, ΔY are calculated from the following equation using the peak quantities, the distances $LX_1$, $LX_2$, $LY_1$, and $LY_2$ derived from the center value of the output circle in the step 440 using the coefficients set in the step 450.

It is noted that the above-described coefficient and following calculation equation use experimental data and are previously derived in such techniques as, e.g., a multi-regression analysis technique (linear combination).

$$\Delta X = a_{1n} + a_{2n}X\max + a_{3n}X^2\max + a_{4n}X\max' LX_1 + a_{5n}(X\max' LX_1)^2 + a_{6n}X\max' LX_2 + a_{7n}(X\max' LX_2)^2$$

$$\Delta Y = b_{1m} + b_{2m}Y\max + b_{3m}Y^2\max + b_{4m}Y\max' LY_2 + b_{5m}(Y\max' LY_1)^2 + b_{6m}Y\max' LY_2 + b_{7m}(Y_{max}' LY_2)^2$$

Next, in a step 470, the magnetization quantity calculating block 4 calculates a center value O' of the directional circle after the vehicle body is magnetized.

X coordinate O'x and Y coordinate O'y of the center value O' after the magnetization on the vehicle body are expressed as:

$$O'x = Ox + \Delta X,$$

$$O'y = Oy + \Delta Y.$$

Next, in a step 480, the center values O'x, O'y after the magnetization are transmitted to the direction detecting block 3 and set as new center values Ox, Oy.

As described above, since the center position coordinates of the output circle after the magnetization can speedily and accurately be calculated when the vehicle body is magnetized, the direction of the vehicle can always be detected.

Figure 13:
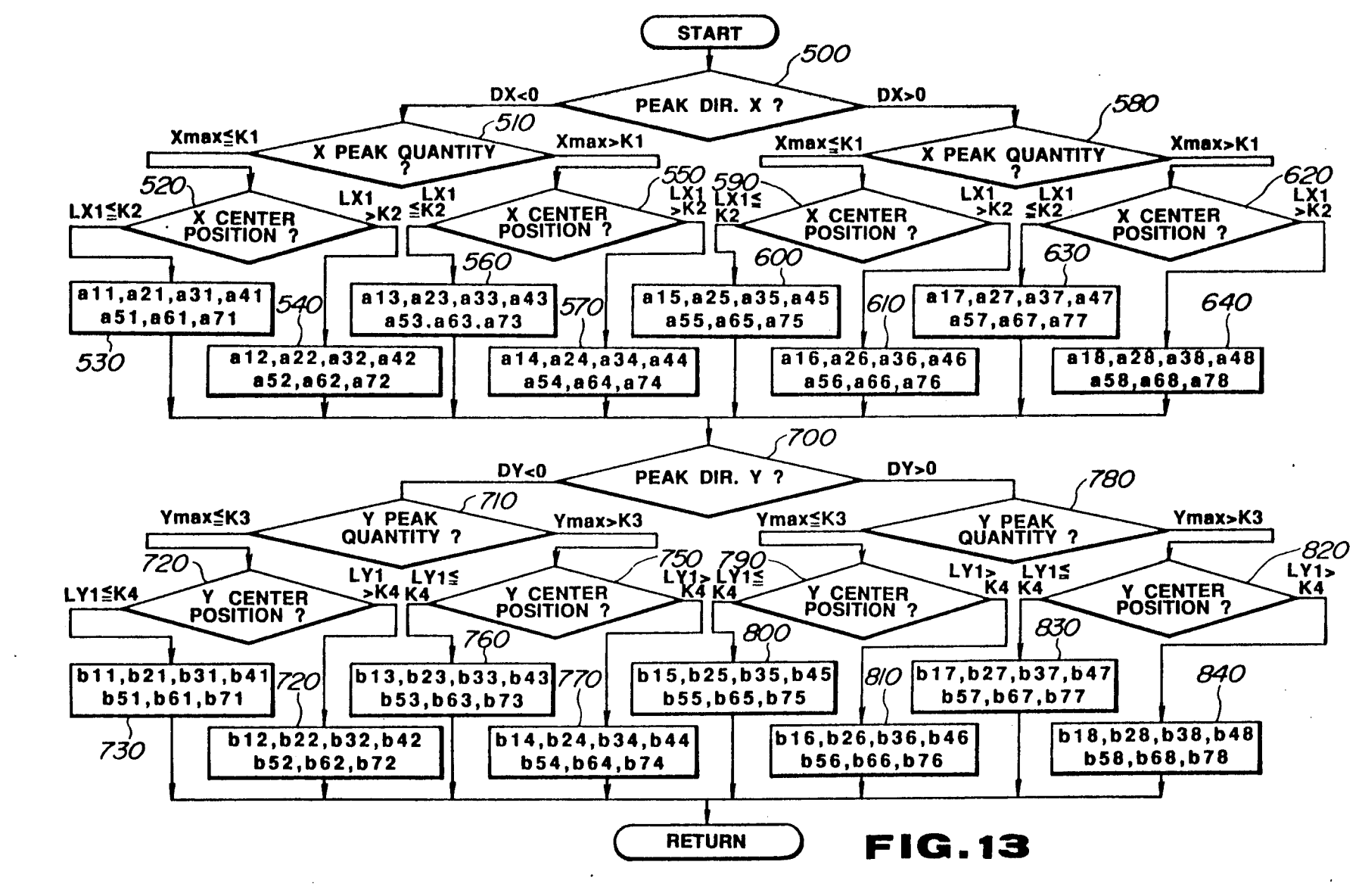

First, in the calculation shown in FIG. 13, the CPU, first, carries out the coefficient setting for X component calculation.

In a step 500, the CPU determines X component peak direction. If minus ($D_x - 0$), the routine goes to a step 510. If plus ($D_x > 0$), the routine advances the step 580.

Hereinafter, the CPU determines whether the X component peak direction is minus.

In a step 510, the CPU compares the peak quantity Xmax with a predetermined value $K_1$. If Xmax $\leqq K_1$, the routine goes to a step 520. If Xmax $> K_1$, the routine goes to a step 550.

When the routine goes to the step 520 if Xmax $\leqq K_1$, the routine goes to a step 520 in which a value $LX_1$ in the X direction of the directional circle center value is compared with a predetermined value $K_2$. If $LX_1 \leqq K_2$, the routine gross to a step 530 in which coefficients for X component calculation $a_{11}, a_{21}, \ldots, a_{71}$ are set to $a_{11}, a_{21}, \ldots, a_{71}$. Then, if $LX_1 > K_2$, the routine goes to a step 540 in which coefficients for X component calculation are set to $a_{12}, a_{22}, \ldots, a_{72}$.

In addition, if the routine goes to a step 550 when Xmax $> K_1$, the center value $LX_1$ of the directional circle in the step 550 is compared with a predetermined value $K_2$. If $LX_1 > K_2$, the routine goes to a step 570 in which coefficients for the X component calculation are set to $a_{14}, a_{24}, \ldots, a_{74}$.

Although the routine in the case where the X component peak direction is determined to be minus in the step 500 is described, the coefficients are respectively set in the steps 580 through 640 in the same way as in the case where the X component peak direction is plus.

In the way described above, a pair of X component calculation coefficients $a_{1n}, a_{2n}, \ldots, a_{7n}$ are set so as to correspond to the X peak direction, X peak direction, and X center value in steps 500 through 640.

In addition, during the set of Y component coefficient, a couple of the coefficients for Y component calculation are set using the steps 700 through 840.

It is noted that since the actual values of the coefficients ($a_{1n}$ through $a_{7n}$: $b_{1m}$ through $b_{7m}$) set as described above are varied according to the form of the vehicle body (for example, sedan type or one box type), they are previously derived according to the vehicle models. Then, values corresponding to the parameters are selected and set using the above-described calculations.

In addition, the respective predetermined values in the calculation of the above-described X component and Y component are, e.g., $K_1 = 500$ (mG), $K_2 = 1500$ (mG), $K_3 = 500$ , (mG) and $K_4 = 1500$ (mG).

As described above, although the coefficients for the component calculations are set corresponding to the peak direction, peak quantity, and center position of the circle before the occurrence of magnetization, the reason is as follows:

Since, in the calculation of the preferred embodiment, the calculation of the center value from the base point is varied according to the peak direction, it is necessary to change the coefficients according to the peak direction.

Since the magnetization of the vehicle body is rarely generated due to the less peak quantity, the coefficients are varied according to the peak quantity.

If the peak quantity is reduced, the coefficients become almost zero.

Since, in addition, the center movement becomes slightly different with respect to the origin (center position Os of the directional circle in the case where no magnetization occurs) depending on whether the center values of the directional circle is plus or minus, the coefficients are varied corresponding to the center values of the directional circle so that the accuracy of the directional angle of the vehicle body can remarkably be improved.

It is noted that a Japanese Utility Model Application First Publication Heisei 1-117712 published on Aug. 9, 1989, which is a publication of Japanese Utility Model Application Showa 63-8328 which was filed by the assignee which the present application is to be assigned to, exemplifies a vehicle running direction detecting apparatus in which a relative angle change quantity between two points during the vehicle run detected by such a gyroscope sensor and the center position of the output circle by means of the coordinate position indicating the two positions and a Japanese Utility Model Application First Publication Heisei 1-144814 published on Dec. 4, 1989, which is a publication of Japanese Utility Model Application Showa 63-41579, a vehicle running direction measuring apparatus in which a least square method is applied, a square sum of a difference between a distance in the coordinates between the initial value and momentary value of the center position of the output circle and radius of the output circle is minimized so that the center position of the output circle is corrected.

When the present invention is combined with either or both of the contents of the above-identified Japanese utility Model Applications, a more accurate correction can be carried out.

As described hereinabove, since according to the present invention the center value of the directional circle after the vehicle body has been magnetized is calculated according to the coefficients set correspondingly and each parameter of the direction of the disturbed peak, the peak quantities, and the center value of the directional circle before generation of the peak (before the present magnetization), the correction of the center value can be carried out immediately after the disturbance occurs and the vehicle body is magnetized without the change in the angle of the geomagnetic sensor output due to the turn of the vehicle in a case when the center of the directional circle is deviated due to the magnetization.

Consequently, in a case where the magnetization on a straight way or magnetization in a building which worsens the magnetic environment, the correction of the center value can speedily and accurately be carried out and thereby the direction of the vehicle body toward which the vehicle runs can always be detected.

It will be appreciated by those skilled in the art that the foregoing description has been made in terms of the preferred embodiments and various changes and modifications may be made without departing from the scope of the present invention which is to be defined by the appended claims.

What is claimed is:

1. An apparatus for measuring a running direction of a vehicle having a body, comprising:

a) a geomagnetic direction sensor, mounted to the vehicle, which is so constructed and arranged as to detect a direction of geomagnetism in a form of two directional component data mutually orthogonal to each other on a horizontal plane of the vehicle and producing an output;

b) first means for deriving a running direction of the vehicle on the basis of a direction toward a coordinate position indicated by the two directional component data from coordinates of a center position of an output circle derived from said geomagnetic direction sensor;

c) second means for determining whether or not there is a disturbance due to magnetization on the body of the vehicle from said output of said geomagnetic direction sensor;

d) third means for calculating, when said second means determines that said disturbance exists, a peak direction and a peak quantity of said disturbance and a value of a center of an output circle derived before said disturbance and producing parameters representative of said peak direction, said peak quantity and said value of the center of the output circle derived before said disturbance, respectively;

e) fourth means for selecting and setting optimum coefficients out of previously derived coefficients for said parameters produced by said third means;

f) fifth means for combining each of said parameters produced by said third means with each of said coefficients selected and set by said fourth means to provide a quantity of magnetization on the body of the vehicle; and g) sixth means responsive to said quantity of magnetization for deriving a coordinate value of a center of an output circle derived after said disturbance.

2. An apparatus as set forth in claim 1, wherein the second means includes seventh means for calculating an average for each of the two directional component data for each sampling period, each said average being defined as:

$$\overline{X} = \sum_{i=1}^{20} X_i/20$$

$$\overline{Y} = \sum_{i=1}^{20} Y_i/20,$$

wherein $X_i$ and $Y_i$ denotes an X and Y coordinate directional geomagnetic component data derived from the geomagnetic direction sensor;

eighth means for deriving a difference R as a reference point between the average value ($\overline{Y}$, $\overline{Y}$) and selected two directional component data (X, Y), said difference R being defined as:

$$R=\{(X-\overline{X})^2+(Y-\overline{Y})^2\}^{\frac{1}{2}};\text{ and}$$

ninth means for determining whether the value of said difference R is equal to or less than a predetermined value which corresponds to an intensity of the geomagnetism.

3. An apparatus as set forth in claim 2, wherein the second means includes tenth means for calculating a difference $R_t$, between a newly input two directional data (Xn, Yn) and the reference point R, said difference Rt being defined as:

$$R_t=\{(X_n-X)^2+(Y_n-Y)^2\}^{\frac{1}{2}};$$

eleventh means for determining whether a present value of Rt exceeds a previous value of R; and twelfth means for updating the present value of Rt to the previous value of R and determining whether the previous value of R updated by the twelfth means is equal to or larger than another predetermined value corresponding to an intensity of the magnetization on the body of the moving object.

4. An apparatus as set forth in claim 3, wherein the third means includes thirteenth means, when the previous value of R is equal to or larger than the other predetermined value, for receiving peak point coordinates ($P_x$, $P_y$) and reference point coordinates ($K_x$, $K_y$) and calculating a peak quantity and peak direction using the following equations:

Peak Quantity $$X_{max}: |Px - Kx|$$
$$Y_{max}: |Px - Ky|$$

Peak Direction $$Dx = (P_x - K_x)/(|P_x - K_x|)$$
$$Dy = (P_y - K_y)/(|P_y - K_y|),$$

fourteenth means for setting base points B1, B2 at which the coordinates of a center of the directional circle moved due to magnetization of the body of the moving object do not exceed; and fifteenth means for calculating distances $LX_1$, $LX_2$, $LY_1$, $LY_2$ of the directional circle before the present magnetization occurs:

$$LX_1=O_x-B1_x$$

$$LX_2=B2_x-O_x$$

$$LY_1=O_y-B1_y$$

$LY_{2y}=B2_y-O_y$ $O_x$; X coordinate of 0
$O_y$; Y coordinate of 0
$B1_x$; X coordinate of B1
$B1_y$; Y coordinate of B1
$B2_x$; X coordinate of B2
$B2_y$; Y coordinate of B2,
wherein B1 and B2 denote minus and plus direction limits of a range in the X, Y coordinates in which the directional circle is moved and derived through experiments.

5. An apparatus as set forth in claim 4, wherein the fourth means carries out the settings of the coefficients ($a_{1n}$ to $a_{7n}$; $b_{1m}$ to $b_{7m}$), these coefficients being set according to the peak direction, peak quantity, and the coordinate values of the center of the output circle before the magnetization on the body of the moving object occurs.

6. An apparatus as set forth in claim 5, wherein the fifth means calculates the magnetization quantity using a multi-regression analysis technique:

$$\Delta X = a_{1n} + a_{2n}X\max + a_{3n}X^2\max + a_{4n}X_{max}'LX_1 + a_{5n}(X_{max}'LX_1)^2 + a_{6n}X_{max}'LX_2 + a_{7n}(X_{max}'LX_2)^2$$

$$\Delta Y = b_{1m} + b_{2m}Y_{max} + b_{3m}Y^2_{max} + b_{4m}Y_{max}'LY_1 + b_{5m}(Y_{max}'LY_1)^2 + b_{6m}Y_{max}'LY_2 + b_{7m}(Y_{max}'LY_2)^2.$$

7. An apparatus as set forth in claim 6, wherein the sixth means derives a value o' of the directional circle after the body of moving object is magnetized.

8. An apparatus as set forth in claim 7, wherein the sixth means derives X coordinate and Y coordinate of the center value after the magnetization of moving object occurs which are expressed as follows:

$$O'x=Ox+\Delta X.$$

$$O'y=Oy+\Delta Y.$$

9. An apparatus as set forth in claim 6, wherein each coefficient is varied according to a form of the moving object.

10. An apparatus as set forth in claim 8, wherein the moving object is a vehicle.

11. An apparatus as set forth in claim 9, wherein the predetermined value substantially corresponds to 40 milligausses (mG) and the other predetermined value substantially corresponds to 400 milligausses (mG).

12. An apparatus for measuring a running direction of a vehicle having a body, comprising:

a) a geomagnetic direction sensor for detecting geomagnetic direction components on a horizontal plane of the vehicle mutually perpendicular to each other and producing an output describing a directional circle having a center coordinate position of said directional circle and a direction from said center coordinate position to a coordinate position indicated by both geomagnetic directional components;
b) first means for determining whether or not there is a distrubance due to magnetization on the body of the vehicle from said output of said geomagnetic direction sensor;
c) second means for calculating, when said first means determines that said disturbance exists, a peak direction and a peak quantity of said disturbance, and a value of a center of an output circle derived before said distrubance and producing parameters representative of said peak direction, said peak value, and said value of the center of the output circle before said disturbance, respectively;
d) third means for selecting and setting optimum coefficients for said parameters produced by said second means out of previously derived coefficients;
e) fourth means for combining each of said parameters produced by said second means with each of said coefficients selected and set by said third means to provide a quantity of magnetization on the body of the vehicle; and
f) fifth means responsive to said quantity of magnetization for deriving a coordinate value of a center of an output circle derived after said disturbance.

13. An apparatus as set forth in claim 12, wherein the geomagnetic direction sensor includes two mutually perpendicular windings on a magnetic core, one being wound on the magnetic core in a direction parallel to a width direction of the vehicle and the other being wound on the magnetic core in a direction parallel to a length direction of the vehicle.

14. A method for measuring a running direction of a vehicle having a body, comprising the steps of:

a) providing a geomagnetic direction sensor, mounted to the vehicle, which is so constructed and arranged as to detect a direction of the geomagnetism in a form of two directional component data mutually orthogonal to each other on a horizontal plane of the vehicle and producing an output;
b) deriving a running direction of the vehicle on the basis of a direction toward a coordinate position indicated by the two directional component data from coordinates of a center position of an output circle derived from said geomagnetic direction sensor;
c) determining whether or not there is a disturbance due to magnetization on the body of the vehicle from said output of said geomagnetic direction sensor;
d) calculating, when it is determined that said disturbance exists, a peak direction and a peak quantity of said disturbance and a value of a center of an output circle derived before said disturbance and producing parameters representative of said peak direction, said peak quantity and said value of the center of the output circle derived before said disturbance, respectively;
e) selecting and setting optimum coefficients out of previously derived coefficients for said parameters produced in step d);
f) combining each of said parameters with each of said coefficients to provide a quantity of magnetization; and
g) deriving, responsive to said quantity of magnetization, a coordinate value of a center of an output circle derived after said disturbance.

* * * * *